(12) United States Patent
Nishimura et al.

(10) Patent No.: US 9,673,166 B2
(45) Date of Patent: Jun. 6, 2017

(54) THREE-DIMENSIONAL MOUNTING METHOD AND THREE-DIMENSIONAL MOUNTING DEVICE

(71) Applicant: TORAY ENGINEERING CO., LTD., Chuo-ku, Tokyo (JP)

(72) Inventors: Koji Nishimura, Otsu (JP); Katsumi Terada, Otsu (JP); Mikio Kawakami, Otsu (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 0 days.

(21) Appl. No.: 15/038,963

(22) PCT Filed: Nov. 19, 2014

(86) PCT No.: PCT/JP2014/080610
§ 371 (c)(1),
(2) Date: May 24, 2016

(87) PCT Pub. No.: WO2015/079991
PCT Pub. Date: Jun. 4, 2015

(65) Prior Publication Data
US 2017/0005068 A1    Jan. 5, 2017

(30) Foreign Application Priority Data

Nov. 27, 2013 (JP) .................................. 2013-244496

(51) Int. Cl.
*H01L 21/68* (2006.01)
*H01L 23/00* (2006.01)
(Continued)

(52) U.S. Cl.
CPC .............. *H01L 24/81* (2013.01); *H01L 24/75* (2013.01); *H01L 25/0657* (2013.01);
(Continued)

(58) Field of Classification Search
CPC ...... H01L 21/68; H01L 21/681; H01L 23/544
See application file for complete search history.

(56) References Cited

U.S. PATENT DOCUMENTS

| 2005/0274869 | A1* | 12/2005 | Yamauchi | ............. H01L 21/681 250/201.5 |
| 2007/0037318 | A1* | 2/2007 | Kim | ................... B23K 26/0643 438/106 |
| 2013/0062101 | A1* | 3/2013 | Kanai | .................. H05K 3/4069 174/251 |

FOREIGN PATENT DOCUMENTS

| JP | 2006-041006 A | 2/2006 |
| JP | 2009-110995 A | 5/2009 |

(Continued)

OTHER PUBLICATIONS

International Search Report of the corresponding International Application No. PCT/JP2014/080610, dated Feb. 3, 2015.

*Primary Examiner* — Jae Lee
(74) *Attorney, Agent, or Firm* — Global IP Counselors, LLP (57) ABSTRACT

A three-dimensional mounting method for successively laminating N number of upper-layer joining materials includes positioning a first upper-layer joining material relative to a lowermost-layer joining material by recognizing an alignment position of the lowermost-layer joining material and a lower face alignment position of the first upper-layer joining material by a two-field image recognition unit, storing positional coordinates of the alignment position of the lowermost-layer joining material, positioning an (n+1)-th upper-layer joining material relative to an n-th upper-layer joining material by recognizing an upper face alignment position of the n-th upper-layer joining material and a lower face alignment position of the (n+1)-th upper-layer joining material, storing positional coordinates of the upper face (Continued)

alignment position of the n-th upper-layer joining material, recognizing an upper face alignment position of the N-th uppermost-layer joining material, and storing positional coordinates of the upper face alignment position of the N-th uppermost-layer joining material.

12 Claims, 5 Drawing Sheets

(51) Int. Cl.
  *H01L 25/065* (2006.01)
  *H01L 25/00* (2006.01)

(52) U.S. Cl.
  CPC .... *H01L 25/50* (2013.01); *H01L 2224/14181* (2013.01); *H01L 2224/16145* (2013.01); *H01L 2224/16227* (2013.01); *H01L 2224/75252* (2013.01); *H01L 2224/75753* (2013.01); *H01L 2224/75843* (2013.01); *H01L 2224/8113* (2013.01); *H01L 2224/81132* (2013.01); *H01L 2224/81193* (2013.01); *H01L 2224/81203* (2013.01); *H01L 2225/06513* (2013.01); *H01L 2225/06517* (2013.01); *H01L 2225/06565* (2013.01); *H01L 2225/06593* (2013.01)

(56) References Cited

FOREIGN PATENT DOCUMENTS

| | | |
|---|---|---|
| JP | 2011-071225 A | 4/2011 |
| JP | 2011-077173 A | 4/2011 |
| JP | 2014-017471 A | 1/2014 |
| WO | 2009-096454 A1 | 8/2009 |
| WO | 2011-087003 A1 | 7/2011 |

\* cited by examiner

THREE-DIMENSIONAL MOUNTING METHOD AND THREE-DIMENSIONAL MOUNTING DEVICE

CROSS-REFERENCE TO RELATED APPLICATIONS

This application is a U.S. National stage of International Application No. PCT/JP2014/080610 filed on Nov. 19, 2014. This application claims priority to Japanese Patent Application No. 2013-244496 filed with Japan Patent Office on Nov. 27, 2013. The entire disclosure of Japanese Patent Application No. 2013-244496 is hereby incorporated herein by reference.

BACKGROUND

Field of the Invention

The present invention relates to a three-dimensional mounting method and mounting device, with which joining materials, such as semiconductor elements, are successively laminated vertically.

Background Information

Examples of methods for the three-dimensional mounting of semiconductor elements include a COC (chip on chip) method in which chips are successively laminated on another chip, a COW (chip on wafer) method in which chips are successively laminated on a wafer, and a WOW (wafer on wafer) method in which wafers are successively laminated on another wafer. Regardless of which three-dimensional mounting method is used, it is necessary for the upper-layer joining materials to be successively laminated and joined in a state in which the positions of the electrodes of the upper-layer joining materials are aligned with the position of the electrode (including a bump) of the lower-layer joining materials (see Japanese Unexamined Patent Application Publication No. 2009-110995 (Patent Literature 1), for example).

When the upper-layer joining materials are successively laminated in this three-dimensional mounting, first a recognition means (such as a CCD camera) is used to recognize from above the alignment position of the lowermost-layer joining material (the position of an electrode or an alignment mark), then the alignment position of the lower face of a first upper-layer joining material (the position of a lower electrode or a lower alignment mark) laminated over this is recognized from below by the recognition means using the recognized alignment position of the lowermost-layer joining material as a reference, and after the lowermost-layer joining material and the first upper-layer joining material have been positioned, the first upper-layer joining material is joined by thermocompression to the lowermost-layer joining material. Then, the alignment position of the upper face of the joined first upper-layer joining material (the position of the upper electrode or an upper alignment mark) is recognized by the recognition means from above, the position of the second upper-layer joining material laminated over this is recognized by the recognition means from below using the recognized position of the first upper-layer joining material as a reference, and after the first upper-layer joining material and the second upper-layer joining material have been positioned, the second upper-layer joining material is joined by thermocompression to the first upper-layer joining material. Similarly, the position of the n-th upper-layer joining materials (where n is an integer of at least 1) is recognized by the recognition means from above, the position of the (n+1)-th upper-layer joining material laminated over this is recognized by the recognition means from below using the recognized position of the n-th upper-layer joining material as a reference, and after the n-th upper-layer joining material and the (n+1)-th upper-layer joining material have been positioned, the (n+1)-th upper-layer joining material is joined by thermocompression to the n-th upper-layer joining material.

In International Publication No. WO 2011/087003 (Patent Literature 2), rather than positioning between individual joint sites, there is a step in which mounting that involves the positioning and joining of upper-layer joining materials is successively performed using the position of the lowermost-layer joining material as a reference, and the upper-layer joining materials are thereby laminated.

SUMMARY

Even when joining materials have been positioned, thermocompression can sometimes produce mounting offset. That is, in joining during the various laminations, even if the lower-layer joining material and the upper-layer joining material are positioned very accurately, that does not guarantee good quality after lamination. In particular, if inclination occurs in the lamination height, then even if the positioning is done properly, the pressing force during joining also moves in the planar direction of the joining materials, and this can cause mounting offset. In view of this, it is necessary to check whether this mounting offset has occurred, but because numerous layers are involved, when inspection is performed with an X-ray imaging device, the images of the various layers end up overlapping, preventing correct evaluation. Also, if a cross section of the layers is observed, that entails a destructive test, so not all of the products can be inspected, and there is a limit to how many can be sampled, so not all defects can be found.

In view of this, it is an object of the present application to provide a three-dimensional mounting method and a three-dimensional mounting device with which mounting offset between joining materials can be easily evaluated by a non-destructive method in the three-dimensional mounting of a plurality of layers of these materials.

To solve the above problem, the first aspect is a three-dimensional mounting method in which N number of upper-layer joining materials equipped with electrodes on their top and bottom faces are successively laminated onto a lowermost-layer joining material equipped with electrodes, with the positions of the electrodes in an aligned state, wherein:

when laminating a first upper-layer joining material over the lowermost-layer joining material, positioning is performed by using a two-field image recognition means to recognize the alignment position of the lowermost-layer joining material and a lower face alignment position that is marked on the lower face of the first upper-layer joining material, and the positional coordinates of the alignment position of the lowermost-layer joining material are stored, when joining the (n+1)-th upper-layer joining material over the n-th upper-layer joining material, where $1 \leq n \leq N-1$, positioning is performed by using the two-field image recognition means to recognize an upper face alignment position marked on the upper face of the n-th upper-layer joining material and a lower face alignment position marked on the lower face of the (n+1)-th upper-layer joining material, the upper face alignment position of the n-th upper-layer joining material is recognized, and the positional coordinates are stored, and the N-th uppermost-layer joining material is laminated, after which the upper face alignment position marked on the upper face of the N-th upper-layer joining material is recognized and the positional coordinates are stored.

The second aspect is a three-dimensional mounting method in which N number of upper-layer joining materials equipped with electrodes on their top and bottom faces are successively laminated onto a lowermost-layer joining material equipped with electrodes, with the positions of the electrodes in an aligned state, wherein:

when laminating a first upper-layer joining material over the lowermost-layer joining material, positioning is performed by using a two-field image recognition means to recognize the alignment position of the lowermost-layer joining material and a lower face alignment position that is marked on the lower face of the first upper-layer joining material, and the positional coordinates of the alignment position of the lowermost-layer joining material are stored, when joining the (n+1)-th upper-layer joining material over the n-th upper-layer joining material, where 1≤n≤N−1, the upper field of the two-field image recognition means is used to recognize the lower face alignment position marked on the lower face of the (n+1)-th upper-layer joining material, positioning is performed with the alignment position of the lowermost-layer joining material, and the lower field of the two-field image recognition means is used to recognize the upper face alignment position of the n-th upper-layer joining material, and the positional coordinates are stored, and the N-th uppermost-layer joining material is laminated, after which the upper face alignment position marked on the upper face of the N-th upper-layer joining material is recognized and the positional coordinates are stored.

The third aspect is the three-dimensional mounting method according to the first or second aspect, wherein the work of recognizing the upper face alignment position marked on the upper face of the N-th upper-layer joining material is performed with the lower field of the two-field image recognition means.

The fourth aspect is the three-dimensional mounting method according to any one of the first to third aspects, wherein mounting offset between the lowermost-layer joining material and the first upper-layer joining material is evaluated from a comparison of the coordinates of the alignment position of the lowermost-layer joining material and the coordinates of the upper face alignment position of the first upper-layer joining material, and mounting offset between the n-th upper-layer joining material and the (n+1)-th upper-layer joining material is evaluated from a comparison of the coordinates of the upper face alignment position of the n-th upper-layer joining material, where 1≤n≤N−1, and the upper face alignment position of the (n+1)-th upper-layer joining material.

The fifth aspect is the three-dimensional mounting method according to any one of the first to fourth aspects, wherein an electrode exposed on a face is used as at least one of the lower face alignment position and the upper face alignment position of an upper-layer joining material.

The sixth aspect is a three-dimensional mounting device in which N number of upper-layer joining materials equipped with electrodes on their top and bottom faces are successively laminated onto a lowermost-layer joining material equipped with electrodes, with the positions of the electrodes in an aligned state, the device comprising:

a stage that supports the lowermost-layer joining material;

a head that supports the successively laminated upper-layer joining materials; and a two-field image recognition means having two fields, upper and lower, wherein, when laminating the first upper-layer joining material over the lowermost-layer joining material, the device has:

a function of performing positioning by recognizing the alignment position of the lowermost-layer joining material and the lower face alignment position marked on the lower face of the first upper-layer joining material, and recognizing the upper face alignment position of the lowermost-layer joining material and storing the positional coordinates;

a function of performing positioning by using the two-field image recognition means to recognize the upper face alignment position marked on the upper face of the n-th upper-layer joining material and the lower face alignment position marked on the lower face of the (n+1)-th upper-layer joining material every time the (n+1)-th upper-layer joining material is joined on the n-th upper-layer joining material, where 1≤n≤N−1, and storing the positional coordinates of the upper face alignment position of the n-th upper-layer joining material; and a function of laminating the N-th uppermost-layer joining material, and then recognizing the upper face alignment position marked on the upper face of the N-th upper-layer joining material, and storing the positional coordinates.

The seventh aspect is a three-dimensional mounting device in which N number of upper-layer joining materials equipped with electrodes on their top and bottom faces are successively laminated onto a lowermost-layer joining material equipped with electrodes, with the positions of the electrodes in an aligned state, the device comprising:

a stage that supports the lowermost-layer joining material;

a head that supports the successively laminated upper-layer joining materials; and a two-field image recognition means having two fields, upper and lower, wherein, when laminating the first upper-layer joining material over the lowermost-layer joining material, the device has:

a function of performing positioning by recognizing the alignment position of the lowermost-layer joining material and the lower face alignment position marked on the lower face of the first upper-layer joining material, and recognizing the upper face alignment position of the lowermost-layer joining material and storing the positional coordinates;

a function of performing positioning with the alignment position of the lowermost-layer joining material by using the upper field of the two-field image recognition means to recognize the lower face alignment position marked on the lower face of the (n+1)-th upper-layer joining material every time the (n+1)-th upper-layer joining material is joined on the n-th upper-layer joining material, where 1≤n≤N−1, using the lower field of the two-field image recognition means to recognize the upper face alignment position of the n-th upper-layer joining material, and storing the positional coordinates; and a function of laminating the N-th uppermost-layer joining material, and then recognizing the upper face alignment position marked on the upper face of the N-th upper-layer joining material, and storing the positional coordinates.

The eighth aspect is the three-dimensional mounting device according to the sixth or seventh aspect, wherein the lower field of the two-field image recognition means has the function of recognizing the upper face alignment position marked on the upper face of the N-th joining material.

The ninth aspect is the three-dimensional mounting device according to any one of the sixth to eighth aspects, wherein the device has:

a function of comparing the coordinates of the alignment position of the lowermost-layer joining material with the coordinates of the upper face alignment position of the first upper-layer joining material, and evaluating mounting offset between the lowermost-layer joining material and the first upper-layer joining material; and a function of comparing the coordinates of the upper face alignment position of the n-th upper-layer joining material, where 1≤n≤N−1, with the coordinates of the upper face alignment position of the (n+1)-th upper-layer joining material, and evaluating mounting offset between the n-th upper-layer joining material and the (n+1)-th upper-layer joining material.

With the three-dimensional mounting method and three-dimensional mounting device pertaining to the present application, mounting offset between joining materials can be evaluated easily and in a non-destructive manner during mounting. Accordingly, all layers can be inspected, and the mounting of any further upper layers can be halted at the point when mounting offset is discovered, so this prevents material from being wasted.

DETAILED DESCRIPTION OF EMBODIMENTS

A preferred embodiment of the present application will now be described through reference to the drawings.

Figure 1:
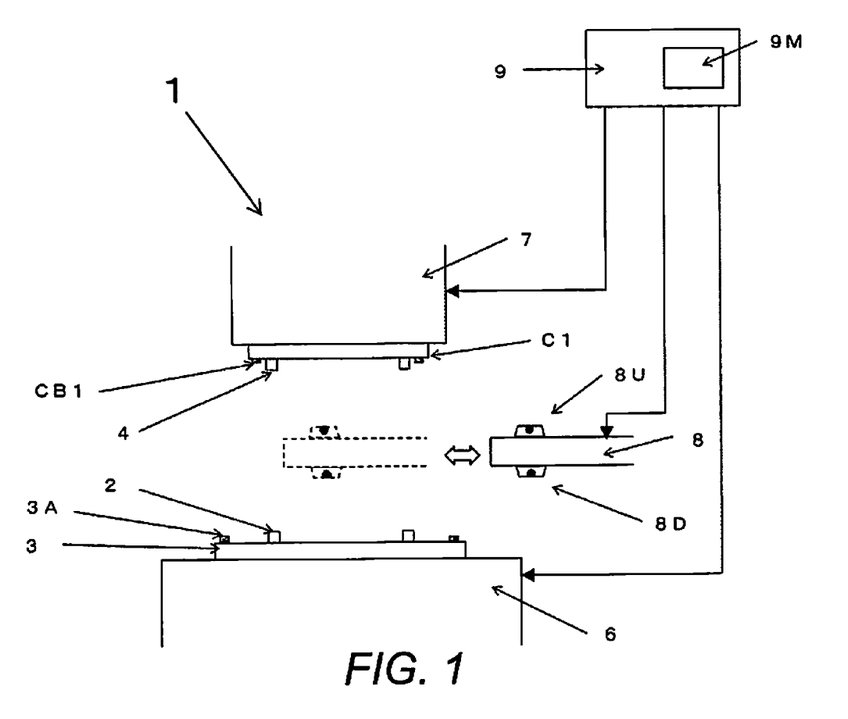
FIG. 1 is a diagram of the configuration of the three-dimensional mounting device pertaining to an embodiment, and shows the process of mounting a first upper-layer chip onto a substrate.

FIG. 1 shows a three-dimensional mounting device 1 pertaining to an embodiment of. The three-dimensional mounting device 1 is configured such that N number of chips (a first upper-layer chip C1, a second upper-layer chip C2, . . . , an N-th upper-layer chip CN from a substrate 3) are successively laminated in an aligned state as upper-layer joining materials comprising electrodes 4 above and below, onto the substrate 3 serving as a lowermost-layer joining material equipped with electrodes 2. As shown in FIG. 1, the basic constituent elements of the three-dimensional mounting device 1 are a stage 6 that supports the substrate 3 by suction, a head 7 that supports the chips C (this does not refer to any of the first upper-layer chip C1, the second upper-layer chip C2, . . . , and the N-th upper-layer chip CN in particular) by suction and has the function of performing thermocompression bonding to the substrate 3, a first recognition means 8D for recognizing the alignment position of a lower-layer joining material to be joined (such as the position of an alignment mark), and a second recognition means 8U for recognizing the alignment position of a chip C supported by the head 7 (such as the position of an alignment mark), and the stage 6, the head 7, the first recognition means 8D, and the second recognition means 8U are connected to a mounting control device 9.

In this embodiment, the first recognition means and the second recognition means are configured as a two-field camera 8 that is a two-field image recognition means having fields in two directions (above and below). That is, with the two-field camera 8 in FIG. 1, the first recognition means 8D is the lower field, and the second recognition means 8U is the upper field. The two-field camera 8 is provided between a joining material below (the substrate 3 or a chip C below) and a chip C above, so as to be able to move back and forth as needed with respect to the mounting position of the chip C above.

The three-dimensional mounting device 1 has a movement means capable of controlling the relative positions of the stage 6 supporting the substrate 3 and the head 7 supporting the chips C that are successively laminated from above, and the mounting control device 9 controls this movement means so that the chips C above are positioned with respect to the joining material below (the substrate 3 or a chip C below). In this embodiment, the position on the stage 6 side is controlled for the purpose of this positioning, but the configuration may instead be such that the position on the head 7 side is controlled, or such that positions on both sides are controlled.

The mounting control device 9 performs both control of the two-field camera 8 and signal processing. The mounting control device 9 is equipped with a memory 9M, and has a function of storing in the memory 9M the alignment position of a joining material below (the substrate 3 or a chip C below) that has been recognized by the first recognition means 8D, and a function of performing control so that a chip C above that has been recognized by the second recognition means is put in a specific position using the stored alignment position of the joining material below (the substrate 3 or a chip C below) as a reference.

Three-dimensional mounting is performed as follows, for example.

First, as shown in FIG. 1, the alignment position 3A (the position of an alignment mark) of the substrate 3 supported on the stage 6 is recognized by the first recognition means 8D, and this position information is stored in the memory 9M inside the mounting control device 9. Meanwhile, the lower face alignment position CB1 (the position of an alignment mark) of the first upper-layer chip C1 is recognized by the second recognition means 8U, this position information is compared to the information about the alignment position 3A of the substrate 3, and the relative positions of the head 7 supporting the first upper-layer chip C1 and the stage 6 supporting the substrate 3 are controlled so that the positions of the electrodes 2 and 4 match up. In this embodiment, since the position on the stage 6 is controlled, position control of the stage 6 is performed on the basis of both sets of position information. After this, the head 7 is lowered, the first upper-layer chip C1 is bonded by thermocompression to the substrate 3, and the first upper-layer chip C1 is joined to and mounted on the substrate 3.

Figure 2A:
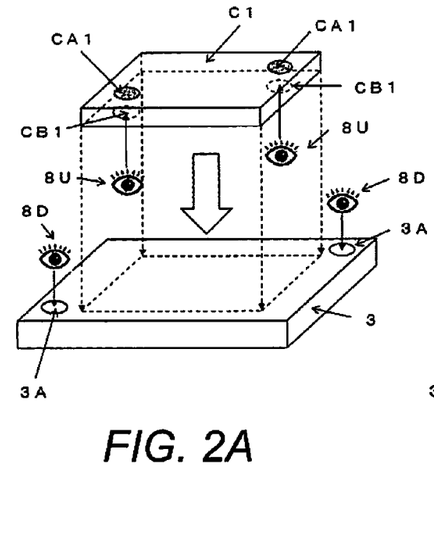
FIG. 2A is an oblique view of the positioning of the substrate and the first upper-layer chip.
Figure 2B:
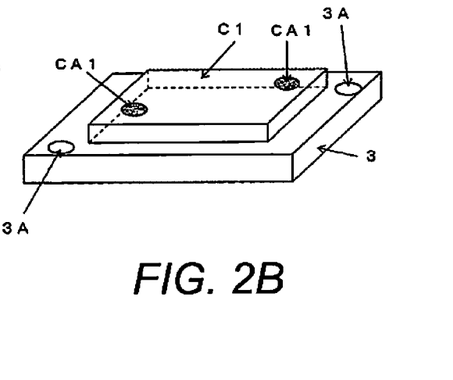
FIG. 2B is an oblique view of the state after mounting.

The above procedure can be viewed from different perspectives. FIG. 2A focuses on the lower face alignment position CB1 of the first upper-layer chip C1 and the alignment position 3A of the substrate 3, while FIG. 2B shows a state in which the first upper-layer chip C1 has been mounted on the substrate 3 through the process described above.

Figure 3:
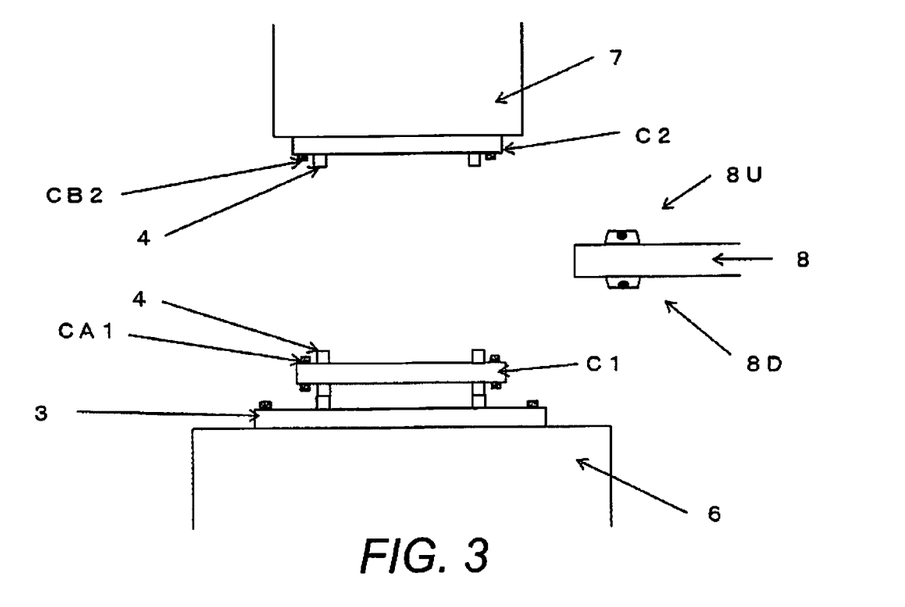
FIG. 3 shows the process of mounting a second upper-layer chip over the first upper-layer chip with the three-dimensional mounting device in FIG. 1.

As shown in FIG. 3, the first recognition means 8D then recognizes the upper face alignment position CA1 marked on the upper face of the first upper-layer chip mounted on the substrate 3, and this position information is stored in the memory 9M inside the mounting control device 9. Meanwhile, the lower face alignment position CB2 of the second upper-layer chip C2 is recognized by the second recognition means 8U, this position information is compared to information for the upper face alignment position CA1 of the first upper-layer chip C1, and the relative positions of the stage 6 and the head 7 supporting the second upper-layer chip C2 are controlled so that the positions of the electrodes 4 will match up. After this, the head 7 is lowered, the second upper-layer chip C2 is bonded by thermocompression to the first upper-layer chip C1, and the second upper-layer chip C2 is joined to the first upper-layer chip C1. As a result, the second upper-layer chip C2 is mounted in a state of being laminated to the substrate 3 along with the first upper-layer chip C1.

Figure 4A:
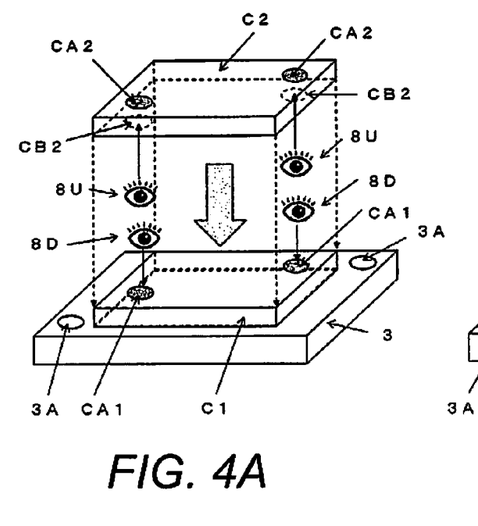
FIG. 4A is an oblique view of the positioning of the first upper-layer chip and the second upper-layer chip.
Figure 4B:
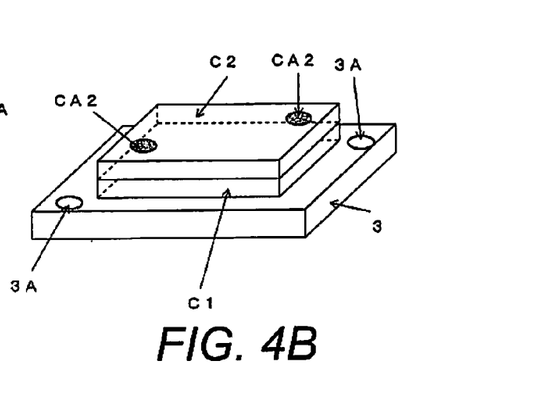
FIG. 4B is an oblique view of the state after mounting.

In this regard, FIG. 4A focuses on the upper face alignment position CA1 of the first upper-layer chip C1 and the lower face alignment position CB2 of the second upper-layer chip C2, and FIG. 4B shows a state in which the second upper-layer chip C2 has been laminated to and mounted on the first upper-layer chip C1 by going through the above process.

Figures 5A, 5B:
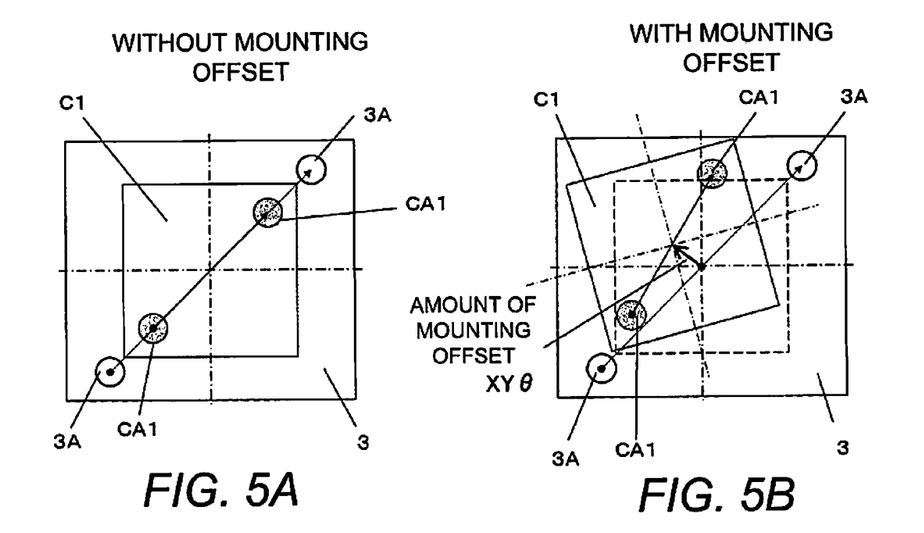
FIGS. 5A and 5B are diagrams illustrating mounting offset between the substrate and the first upper-layer chip.

At the stage discussed above, position information about the upper face alignment position CA1 of the first upper-layer chip C1 and the alignment position 3A of the substrate 3 is stored in the memory 9M inside the mounting control device 9. Here, position information about the upper face alignment position CA1 of the first upper-layer chip C1 is position information in a state in which the first upper-layer chip C1 has been mounted and fixed on the substrate 3, so mounting offset between the substrate 3 and the first upper-layer chip C1 can be calculated from the stored alignment positions. Calculation of the mounting position offset can be accomplished by a variety of methods, but an example is shown in FIGS. 5A and 5B, in which offset is found in the X direction, the Y direction, and the rotation direction (the e direction).

Figure 6:
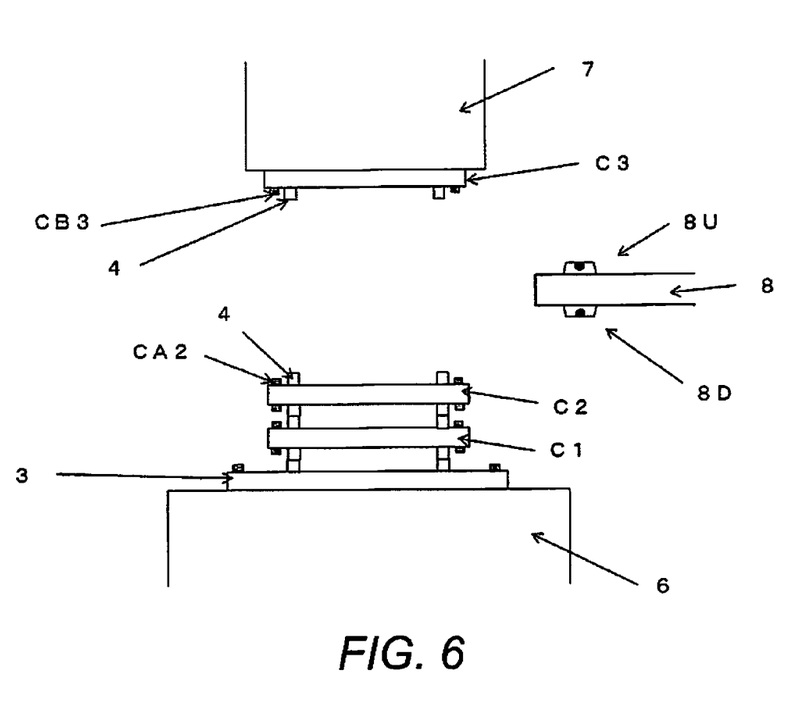
FIG. 6 shows the process of mounting a third upper-layer chip over the second upper-layer chip with the three-dimensional mounting device in FIG. 1.

As shown in FIG. 6, after this the first recognition means 8D recognizes the upper face alignment position CA2, which is marked on the upper face of the second upper-layer chip C2, of the second upper-layer chip C2 and the first upper-layer chip C1 fixed in a laminated state to the substrate 3, and this position information is stored in the memory 9M inside the mounting control device 9. Meanwhile, the lower face alignment position CB3 of the third upper-layer chip C3 is recognized by the second recognition means 8U, this position information is compared to information about the upper face alignment position CA2 of the second upper-layer chip C2, and the relative positions of the stage 6 and the head 7 supporting the third upper-layer chip C3 are controlled so that the positions of the electrodes 4 will match up. After this, the head 7 is lowered, the third upper-layer chip C3 is bonded by thermocompression to the second upper-layer chip C2, and the third upper-layer chip C3 is mounted in a state of being laminated to the substrate 3 along with the first upper-layer chip C1 and the second upper-layer chip C2.

Figure 7A:
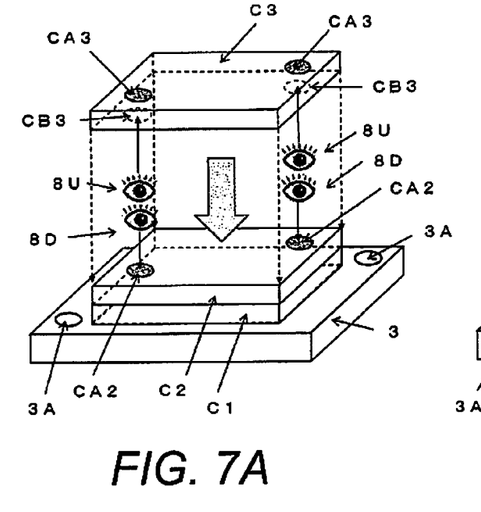
FIG. 7A is an oblique view of the positioning of the second upper-layer chip and the third upper-layer chip.
Figure 7B:
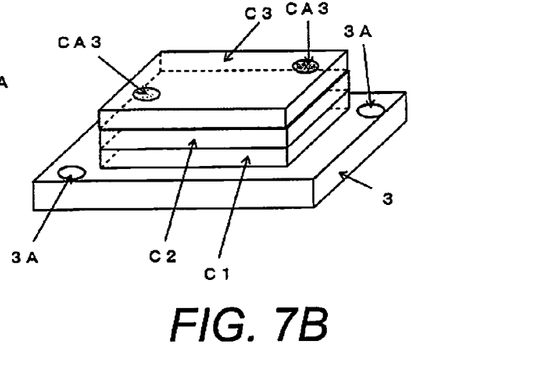
FIG. 7B is an oblique view of the state after mounting.

In this regard, FIG. 7A focuses on the lower face alignment position CB3 of the third upper-layer chip C3 and the upper face alignment position CA2 of the second upper-layer chip C2, and FIG. 7B shows a state in which the third upper-layer chip C3 has been laminated to and mounted on the second upper-layer chip C2 by going through the above process.

At this stage, position information about the upper face alignment position CA1 of the first upper-layer chip C1 and the upper face alignment position CA2 of the second upper-layer chip C2 is also stored in the memory 9M inside the mounting control device 9. Here, the position information about the upper face alignment position CA2 of the second upper-layer chip C2 is position information in a state in which the second upper-layer chip C2 has been mounted and fixed on the first upper-layer chip C1, so mounting offset between the upper-layer chip C1 and the upper-layer chip C2 can be calculated from the stored alignment positions.

Thereafter, the same operation is performed according to the number N of upper-layer chips C to be laminated, and this can be expressed as follows by a general formula. Using the n in $1 \leq n \leq N-1$, the first recognition means 8D recognizes an alignment position CAn marked on the upper face of an n-th (where n is an integer of at least 1) upper-layer chip Cn, for the n-th upper-layer chip Cn from the first upper-layer chip C1 fixed in a state of being laminated onto the substrate 3, and this position information is stored in the memory 9M inside the mounting control device 9. Meanwhile, the second recognition means 8U recognizes the lower face alignment position CBn+1 of the (n+1)-th upper-layer chip Cn+1, this position information is compared to information about the alignment position CAn of the n-th upper-layer chip Cn, and the relative positions of the stage 6 and the head 7 supporting the (n+1)-th upper-layer chip Cn+1 are controlled so that the positions of the electrodes 4 will match up. After this, the head 7 is lowered, the (n+1)-th upper-layer chip Cn+1 is bonded by thermocompression to the n-th upper-layer chip Cn, and the (n+1)-th upper-layer chip Cn+1 is mounted in a state of being laminated to the substrate 3 along with the n-th upper-layer chip Cn from the first upper-layer chip C1.

Also, at this stage, position information about the upper face alignment position CAn−1 of the (n−1)-th upper-layer chip Cn−1, and the upper face alignment position CAn of the n-th upper-layer chip Cn is also stored in the memory inside the mounting control device 9. Here, since the position information about the upper face alignment position CAn of the n-th upper-layer chip Cn is position information in a state in which the n-th upper-layer chip Cn has been mounted and fixed on the (n−1)-th upper-layer chip Cn−1, mounting offset between the upper-layer chip Cn−1 and the upper-layer chip Cn can be calculated from the stored alignment positions.

Figure 8:
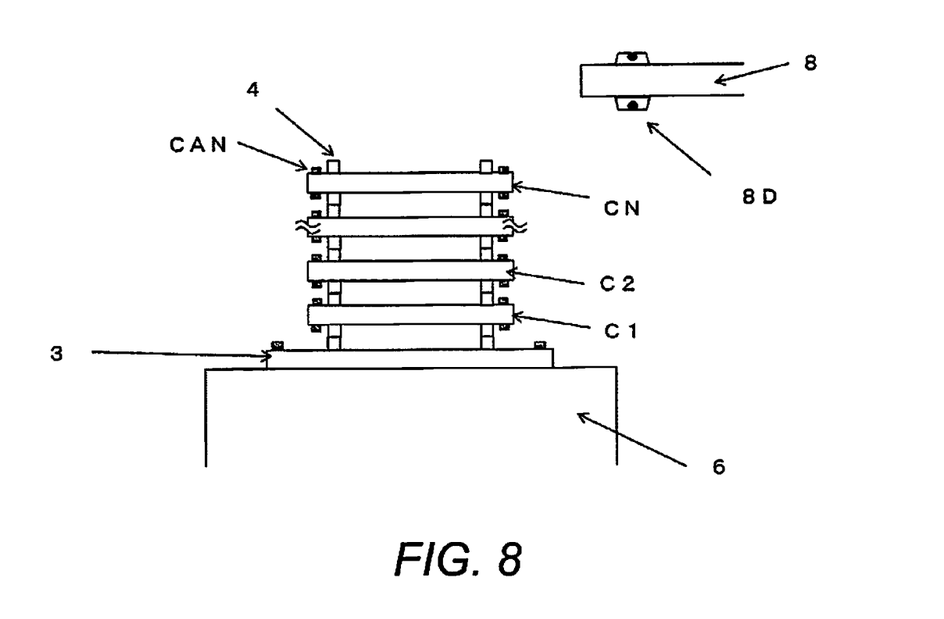
FIG. 8 shows the process of recognizing the upper face alignment position of the uppermost-layer chip with the three-dimensional mounting device in FIG. 1.
Figure 9:
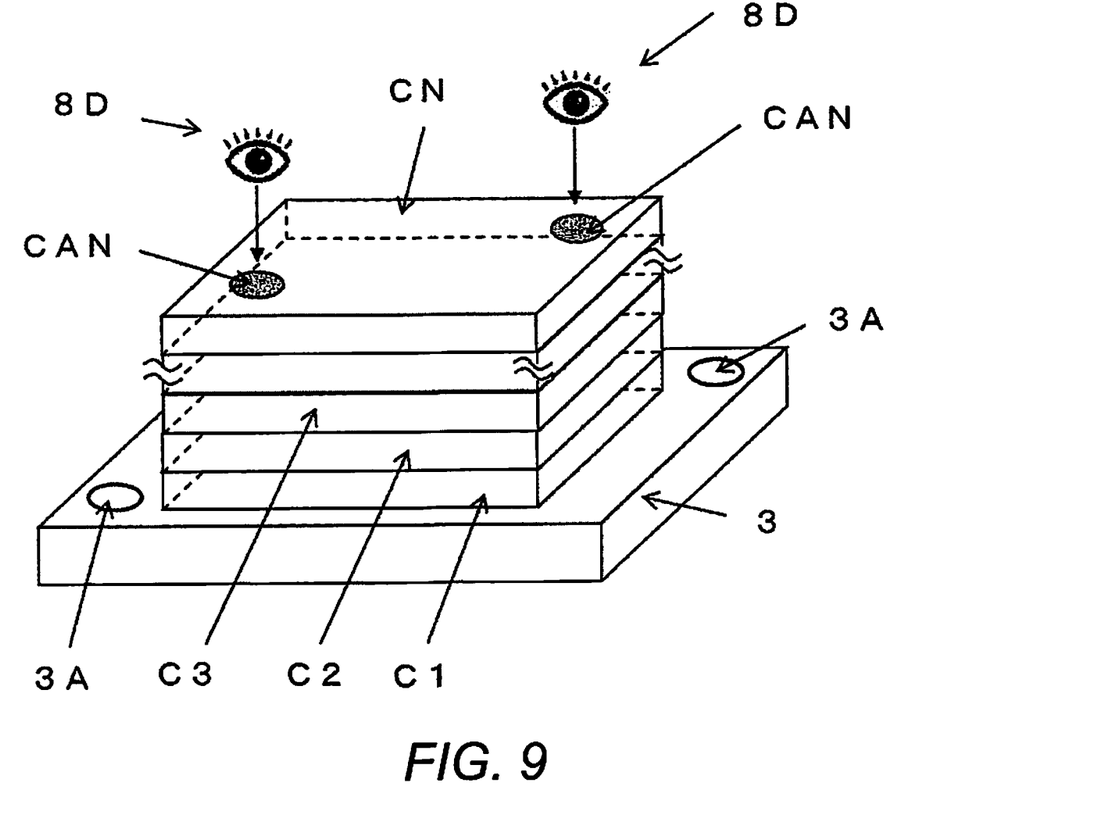
FIG. 9 is an oblique view of a state in which the upper face alignment position of the uppermost-layer chip is recognized.

The lamination process is concluded once the N number of upper-layer chips C to be laminated have been laminated to the substrate 3, but since $n \leq N-1$, positional offset between the (N−1)-th and the N-th upper-layer chips has not been found. In view of this, the upper face alignment position CAN marked on the upper face of the N-th upper-layer chip CN is recognized by the first recognition means 8D, and this position information is stored in the memory 9M inside the mounting control device 9. The value of N, which is the number of upper-layer chips to be laminated, is stored ahead of time in the memory 9M, and the mounting control device 9 counts the number of chips that have been laminated to determine whether or not a chip C is the N-th upper-layer chip CN.

The result of the above procedure is that the mounting offset between joining materials in laminations from the substrate 3, which is the lowermost-layer joining material, up to the N-th upper-layer chip CN, which is the uppermost-layer joining material, can be easily found in a non-destructive manner, and furthermore without requiring the use of an expensive inspection device.

Also, other than the work of recognizing the alignment position CAN of the N-th upper-layer chip CN, which is the uppermost-layer joining material, the storage of the alignment positions and the positioning can be carried out simultaneously. Accordingly, there is almost no time lost in performing three-dimensional mounting, and there is extremely little effect on mass productivity.

In the above embodiment, only the first upper-layer chip C1 used the substrate 3 as a positioning reference, and the upper-layer chips Cn+1 used the upper-layer chips Cn as a positioning reference, but the substrate 3 may be used as a positioning reference for everything from the first upper-layer chip C1 to the upper-layer chip CN. That is, in positioning the N-th upper-layer chip CN from the second upper-layer chip C2, alignment position information about the substrate 3 stored in the memory 9M inside the mounting control device 9 may be used, and there is no need to use the first recognition means 8D for positioning. However, even when the substrate 3 is used as a positioning reference, finding mounting offset between the layers requires that the first recognition means 8D recognize the alignment position of the substrate 3 and the upper face alignment positions (CA1 to CAN) marked on the upper faces for from the first upper-layer chip C1 to the N-th upper-layer chip CN, and that this position information be stored in the memory 9M inside the mounting control device 9.

Also, the electrodes 2 may be used as the alignment position of the substrate 3, and the electrodes 4 provided on the top and bottom of the upper-layer chips may be used as upper face alignment positions and lower face alignment positions of the upper-layer chips.

In the above embodiment, the lowermost-layer joining material was used as a substrate, but the lowermost-layer joining material may be a chip, an interposer, or something else besides a substrate.

With this three-dimensional mounting method and three-dimensional mounting device, because mounting offset between the layers is found successively, if the mounting offset should exceed the permissible range, subsequent lamination of upper-layer chips may be halted. This reduces the number of chips that are used up in defective products.

The three-dimensional mounting method and three-dimensional mounting device pertaining to the present application can be applied to any three-dimensional mounting in which joining materials equipped with electrodes are laminated one after the other.

The invention claimed is:

1. A three-dimensional mounting method in which N number of upper-layer joining materials with electrodes on upper and lower faces are successively laminated onto a lowermost-layer joining material with an electrode such that positions of the electrodes of the upper-layer joining materials and a position of the electrode of the lowermost-layer joining material are arranged in an aligned state, the three-dimensional mounting method comprising:
    when laminating a first upper-layer joining material over the lowermost-layer joining material, positioning the first upper-layer joining material relative to the lowermost-layer joining material by recognizing an alignment position of the lowermost-layer joining material and a lower face alignment position marked on a lower face of the first upper-layer joining material by a two-field image recognition unit, and storing positional coordinates of the alignment position of the lowermost-layer joining material;
    when joining an (n+1)-th upper-layer joining material over an n-th upper-layer joining material, where $1 \leq n \leq N-1$, positioning the (n+1)-th upper-layer joining material relative to the n-th upper-layer joining material by recognizing an upper face alignment position marked on an upper face of the n-th upper-layer joining material and a lower face alignment position marked on a lower face of the (n+1)-th upper-layer joining material by the two-field image recognition unit, and storing positional coordinates of the upper face alignment position of the n-th upper-layer joining material;
    after laminating an N-th uppermost-layer joining material, recognizing an upper face alignment position marked on an upper face of the N-th uppermost-layer joining material, and storing positional coordinates of the upper face alignment position of the N-th uppermost-layer joining material;
    calculating mounting offset between the lowermost-layer joining material and the first upper-layer joining material from a comparison of the positional coordinates of the alignment position of the lowermost-layer joining material and positional coordinates of an upper face alignment position of the first upper-layer joining material after joining the first upper-layer joining material over the lowermost-layer joining material, and
    calculating mounting offset between the n-th upper-layer joining material and the (n+1)-th upper-layer joining material from a comparison of the positional coordinates of the upper face alignment position of the n-th upper-layer joining material and positional coordinates of an upper face alignment position of the (n+1)-th upper-layer joining material after joining the (n+1)-th upper-layer joining material over the n-th upper-layer joining material.

2. A three-dimensional mounting method in which N number, where $N \geq 2$, of upper-layer joining materials with electrodes on upper and lower faces are successively laminated onto a lowermost-layer joining material with an electrode such that positions of the electrodes of the upper-layer joining materials and a position of the electrode of the lowermost-layer joining material are arranged in an aligned state, the three-dimensional mounting method comprising:
    when laminating a first upper-layer joining material over the lowermost-layer joining material, positioning the first upper-layer joining material relative to the lowermost-layer joining material by recognizing an alignment position of the lowermost-layer joining material and a lower face alignment position marked on a lower face of the first upper-layer joining material by a two-field image recognition unit, and storing positional coordinates of the alignment position of the lowermost-layer joining material;
    when joining an (n+1)-th upper-layer joining material over an n-th upper-layer joining material, where $1 \leq n \leq N-1$, positioning a lower face alignment position marked on a lower face of the (n+1)-th upper-layer joining material relative to the alignment position of the lowermost-layer joining material by recognizing the lower face alignment position of the (n+1)-th upper-layer joining material by an upper field of the two-field image recognition unit, and storing positional coordinates of an upper face alignment position of the n-th upper-layer joining material by recognizing the upper face alignment position of the n-th upper-layer joining material by a lower field of the two-field image recognition unit;

after laminating an N-th uppermost-layer joining material, recognizing an upper face alignment position marked on an upper face of the N-th uppermost-layer joining material, and storing positional coordinates of the upper face alignment position of the N-th uppermost-layer joining material;

calculating mounting offset between the lowermost-layer joining material and the first upper-layer joining material from a comparison of the positional coordinates of the alignment position of the lowermost-layer joining material and positional coordinates of an upper face alignment position of the first upper-layer joining material after joining the first upper-layer joining material over the lowermost-layer joining material, and calculating mounting offset between the n-th upper-layer joining material and the (n+1)-th upper-layer joining material from a comparison of the positional coordinates of the upper face alignment position of the n-th upper-layer joining material and positional coordinates of an upper face alignment position of the (n+1)-th upper-layer joining material after joining the (n+1)-th upper-layer joining material over the n-th upper-layer joining material.

3. The three-dimensional mounting method according to claim 1, wherein
the recognizing of the upper face alignment position marked on the upper face of the N-th uppermost-layer joining material is performed by a lower field of the two-field image recognition unit.

4. The three-dimensional mounting method according to claim 1, wherein
one of the electrodes exposed on the upper and lower faces of one of the upper-layer joining materials is used as one of an upper face alignment position and a lower face alignment position of the one of the upper-layer joining materials.

5. A three-dimensional mounting device in which N number of upper-layer joining materials with electrodes on upper and lower faces are successively laminated onto a lowermost-layer joining material with an electrode such that positions of the electrodes of the upper-layer joining materials and a position of the electrode of the lowermost-layer joining material are arranged in an aligned state, the three-dimensional mounting device comprising:
a stage configured to support the lowermost-layer joining material;
a head configured to support the upper-layer joining materials;
a two-field image recognition unit having upper and lower field; and
a controller configured to, when laminating a first upper-layer joining material over the lowermost-layer joining material, position the first upper-layer joining material relative to the lowermost-layer joining material by recognizing an alignment position of the lowermost-layer joining material and a lower face alignment position marked on a lower face of the first upper-layer joining material, and store positional coordinates of an upper face alignment position of the lowermost-layer joining material by recognizing the upper face alignment position of the lowermost-layer joining material, the controller being further configured to, every time an (n+1)-th upper-layer joining material is joined on an n-th upper-layer joining material, where 1≤n≤N−1, position the (n+1)-th upper-layer joining material relative to the n-th upper-layer joining material by recognizing an upper face alignment position marked on an upper face of the n-th upper-layer joining material and a lower face alignment position marked on a lower face of the (n+1)-th upper-layer joining material by the two-field image recognition unit, and store positional coordinates of the upper face alignment position of the n-th upper-layer joining material, and the controller being further configured to, after laminating an N-th uppermost-layer joining material, recognize an upper face alignment position marked on an upper face of the N-th uppermost-layer joining material, and store positional coordinates of the upper face alignment position of the N-th uppermost-layer joining material, the controller being further configured to calculate mounting offset between the lowermost-layer joining material and the first upper-layer joining material by comparing the positional coordinates of the alignment position of the lowermost-layer joining material with positional coordinates of an upper face alignment position of the first upper-layer joining material after joining the first upper-layer joining material over the lowermost-layer joining material, and the controller being further configured to calculate mounting offset between the n-th upper-layer joining material and the (n+1)-th upper-layer joining material by comparing the positional coordinates of the upper face alignment position of the n-th upper-layer joining material with positional coordinates of an upper face alignment position of the (n+1)-th upper-layer joining material after joining the (n+1)-th upper-layer joining material over the n-th upper-layer joining material.

6. A three-dimensional mounting device in which N number, where N≥2, of upper-layer joining materials with electrodes on upper and lower faces are successively laminated onto a lowermost-layer joining material with an electrode such that positions of the electrodes of the upper-layer joining materials and a position of the electrode of the lowermost-layer joining material are arranged in an aligned state, the three-dimensional mounting device comprising:
a stage configured to support the lowermost-layer joining material;
a head configured to support the upper-layer joining materials;
a two-field image recognition unit having upper and lower field; and
a controller configured to, when laminating a first upper-layer joining material over the lowermost-layer joining material, position the first upper-layer joining material relative to the lowermost-layer joining material by recognizing an alignment position of the lowermost-layer joining material and a lower face alignment position marked on a lower face of the first upper-layer joining material, and store positional coordinates of an upper face alignment position of the lowermost-layer joining material by recognizing the upper face alignment position of the lowermost-layer joining material, the controller being further configured to, every time an (n+1)-th upper-layer joining material is joined on an n-th upper-layer joining material, where 1≤n≤N−1, position a lower face alignment position marked on a lower face of the (n+1)-th upper-layer joining material relative to the alignment position of the lowermost-layer joining material by recognizing the lower face alignment position of the (n+1)-th upper-layer joining material by the upper field of the two-field image recognition unit, and store positional coordinates of an upper face alignment position of the n-th upper-layer joining material by recognizing the upper face alignment position of the n-th upper-layer joining material by the lower field of the two-field image recognition unit, and the controller being further configured to, after laminating an N-th uppermost-layer joining material, recognize an upper face alignment position marked on an upper face of the N-th uppermost-layer joining material, and store positional coordinates of the upper face alignment position of the N-th uppermost-layer joining material, the controller being further configured to calculate mounting offset between the lowermost-layer joining material and the first upper-layer joining material by comparing the positional coordinates of the alignment position of the lowermost-layer joining material with positional coordinates of an upper face alignment position of the first upper-layer joining material after joining the first upper-layer joining material over the lowermost-layer joining material, and the controller being further configured to calculate mounting offset between the n-th upper-layer joining material and the (n+1)-th upper-layer joining material by comparing the positional coordinates of the upper face alignment position of the n-th upper-layer joining material with positional coordinates of an upper face alignment position of the (n+1)-th upper-layer joining material after joining the (n+1)-th upper-layer joining material over the n-th upper-layer joining material.

7. The three-dimensional mounting device according to claim 5, wherein
the lower field of the two-field image recognition unit is configured to recognize the upper face alignment position marked on the upper face of the N-th uppermost-layer joining material.

8. The three-dimensional mounting method according to claim 2, wherein
the recognizing of the upper face alignment position marked on the upper face of the N-th uppermost-layer joining material is performed by a lower field of the two-field image recognition unit.

9. The three-dimensional mounting method according to claim 2, wherein
one of the electrodes exposed on the upper and lower faces of one of the upper-layer joining materials is used as one of an upper face alignment position and a lower face alignment position of the one of the upper-layer joining materials.

10. The three-dimensional mounting method according to claim 3, wherein
one of the electrodes exposed on the upper and lower faces of one of the upper-layer joining materials is used as one of an upper face alignment position and a lower face alignment position of the one of the upper-layer joining materials.

11. The three-dimensional mounting method according to claim 8, wherein
one of the electrodes exposed on the upper and lower faces of one of the upper-layer joining materials is used as one of an upper face alignment position and a lower face alignment position of the one of the upper-layer joining materials.

12. The three-dimensional mounting device according to claim 6, wherein
the lower field of the two-field image recognition unit is configured to recognize the upper face alignment position marked on the upper face of the N-th uppermost-layer joining material.

* * * * *